United States Patent
Sundararajan et al.

(10) Patent No.: US 7,674,636 B2
(45) Date of Patent: Mar. 9, 2010

(54) DYNAMIC TEMPERATURE BACKSIDE GAS CONTROL FOR IMPROVED WITHIN-SUBSTRATE PROCESS UNIFORMITY

(75) Inventors: Radha Sundararajan, Dripping Springs, TX (US); Lee Chen, Cedar Creek, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 182 days.

(21) Appl. No.: 11/684,818

(22) Filed: Mar. 12, 2007

(65) Prior Publication Data
US 2008/0227227 A1 Sep. 18, 2008

(51) Int. Cl.
*H01L 21/66* (2006.01)

(52) U.S. Cl. .............................. 438/14; 438/10; 438/17; 118/725

(58) Field of Classification Search .................... 438/10, 438/11, 14, 17, 18, 706, 710, 715; 118/724, 118/725
See application file for complete search history.

(56) References Cited

U.S. PATENT DOCUMENTS

| 6,492,612 B1 | 12/2002 | Taguchi et al. |
| 6,921,720 B2 * | 7/2005 | Arita et al. ................. 438/706 |
| 2003/0124820 A1 | 7/2003 | Johnsgard et al. |
| 2006/0090855 A1 * | 5/2006 | Kimura ................. 156/345.52 |
| 2006/0207507 A1 | 9/2006 | Oohashi et al. |
| 2007/0040265 A1 | 2/2007 | Umotoy et al. |

FOREIGN PATENT DOCUMENTS

| WO | 02084710 A2 | 10/2002 |
| WO | WO02/086957 A1 | 10/2002 |
| WO | 2008075340 A1 | 6/2008 |

OTHER PUBLICATIONS

European Patent Office, Search Report and Written Opinion, from corresponding PCT/US2008/056478, dated Dec. 4, 2008.

* cited by examiner

*Primary Examiner*—Kevin M Picardat
(74) *Attorney, Agent, or Firm*—Wood, Herron & Evans, L.L.P.

(57) ABSTRACT

A method and apparatus are provided to control the radial or non-radial temperature distribution across a substrate during processing to compensate for non-uniform effects, including radial and angular non-uniformities arising from system variations, or process variations, or both. The temperature is controlled, preferably dynamically, by flowing backside gas differently across different areas on a wafer supporting chuck to vary heat conduction across the wafer. Backside gas flow, of helium, for example, is dynamically varied across the chuck to control the uniformity of processing of the wafer. Ports in the support are grouped, and gas to or from the groups is separately controlled by different valves responsive to a controller that controls gas pressure in each of the areas to spatially and preferably dynamically control wafer temperature to compensate for system and process non-uniformities.

24 Claims, 5 Drawing Sheets

DYNAMIC TEMPERATURE BACKSIDE GAS CONTROL FOR IMPROVED WITHIN-SUBSTRATE PROCESS UNIFORMITY

This application is related to commonly assigned U.S. patent application Ser. No. 11/684,853 entitled "Dynamic Control Of Process Chemistry For Improved Within-Substrate Process Uniformity" by the inventors hereof, filed on even date herewith, and commonly assigned U.S. patent application Ser. No. 11/684,957 entitled "Method For Flexing A Substrate During Processing", filed on even date herewith by Merritt Funk; and hereby expressly incorporated by reference herein.

FIELD OF THE INVENTION

This invention relates to the control of process uniformity across a substrate, including, for example, process uniformity during an etching process performed on a substrate. The invention particularly relates to the control of process uniformity across a substrate by control of the substrate temperature.

BACKGROUND OF THE INVENTION

In semiconductor manufacturing, the complexity of devices formed on semiconductor substrates continues to increase at a rapid pace, while the size of features, such as transistor gates, continues to decrease well below the 93 nanometer (nm) technology node. As a result, manufacturing processes require increasingly sophisticated unit process and process integration schemes, as well as process and hardware control strategies to ensure the uniform fabrication of devices across the substrate. For example, during the fabrication of a gate electrode structure in a transistor device, patterning systems and etching systems, which facilitate the formation of the gate structure in a plurality of material films formed on the substrate, are required to achieve and preserve the gate structure critical dimension (CD) vertically within the device being fabricated as well as laterally across the substrate from device-to-device. A reduction of variations in the CD, as well as variations in profile and side-wall angle (SWA), across the substrate can affect the uniform yield of high performance devices (i.e., speed, power consumption, etc.).

In material processing methodologies, patterning and etching systems are utilized to perform pattern etching, which comprises applying a thin layer of radiation-sensitive material, such as photoresist, to an upper surface of a substrate, patterning this thin layer of radiation-sensitive material using photolithography to form a pattern therein, and transferring the pattern to the underlying material film using an etching process. For example, the patterning of the radiation-sensitive material generally involves coating an upper surface of the substrate with a thin film of radiation-sensitive material (e.g., "photo-resist"), and then exposing the radiation-sensitive material to a geometric pattern of electromagnetic (EM) radiation using, for example, a photolithography system, followed by the removal of the irradiated regions of the radiation-sensitive material (as in the case of positive photo-resist), or non-irradiated regions (as in the case of negative photo-resist) using a developing solvent. Thereafter, the pattern formed in the thin film of radiation-sensitive material is transferred to the underlying layers using an etching process, such as a dry plasma etching process.

During a dry plasma etching process, plasma and the chemistry formed in the presence of plasma are utilized to remove or etch material along fine lines or within vias or contacts patterned on a substrate. The plasma etch process generally involves positioning a semiconductor substrate with an overlying patterned, protective layer, for example a photoresist layer as described above, in a processing chamber. Once the substrate is positioned within the chamber, an ionizable, dissociative gas mixture is introduced within the chamber at a pre-specified flow rate, while a vacuum pump is adjusted to achieve an ambient process pressure. Thereafter, plasma is formed when a fraction of the gas species present are ionized by electrons heated in the presence of an alternating electric field which is created via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

In these plasma etching systems, the uniformity of process results across the substrate are affected by spatial variations in plasma density within the process space above the substrate, typically expressed as a spatial distribution of electron density $n_e(r,\theta)$, spatial variations in process chemistry (i.e., spatial distribution of chemical species), and spatial variations of the substrate temperature. Often times, the residence time $\tau(r,\theta)$ of chemical species in the process space may be correlated with the amount of plasma dissociation occurring due to interactions between chemical constituents and energetic electrons and, hence, the residence time may be correlated with process chemistry; i.e., the greater the residence time, the greater the amount of dissociation of chemical constituents and the lesser the residence time, the lesser the dissociation of chemical constituents.

During an etching process, the uniformity of process results can include the uniformity (or non-uniformity) of the spatial distribution of a feature critical dimension (CD) across the substrate or a side-wall angle (SWA) across the substrate. For example, during gate structure formation, it is desirable to achieve a uniform distribution of the gate width (at the top and bottom of the etched feature, as well as the region therebetween) across the substrate following an etching process or series of etching processes.

Because the etch process is affected by the substrate temperature, the distribution of substrate temperature can directly affect the spatial distribution of process results. Moreover, the spatial distribution of substrate temperature, if controlled, may be utilized to compensate for other process or system non-uniformities. In conventional processing systems, one element that affects substrate temperature is the thermal contact between the substrate and the substrate holder. For instance, when a substrate is clamped to the substrate holder, a heat transfer gas, such as helium, is introduced to the microspace between the backside of the substrate and the topside of the substrate holder in order to improve the thermal conduction between the substrate and substrate holder. With the exception of a small leakage of heat transfer gas at the peripheral edge of the substrate, the net flow of heat transfer gas to the backside of the substrate is substantially zero.

Conventional substrate holders have been provided that utilize a multi-zone backside gas supply system to adjust the distribution of heat transfer gas in order to affect a radial variation in substrate temperature. For example, two-zone (center/edge) or three-zone (center/mid-radius/edge) backside gas supply systems are common, particularly in etching systems. However, these systems facilitate only static distributions of the heat transfer gas.

Since improving process uniformity in semiconductor manufacturing has always been an important goal, there remains a need for systems that improve process parameter uniformity across the surfaces of substrates during processing.

SUMMARY OF THE INVENTION

A general objective of the present invention is to improve process uniformity in semiconductor manufacturing across the surfaces of substrates during processing.

A more particular objective of the invention is to provide process parameter control to offset non-uniform effects of process conditions to improve process uniformity across the surfaces of substrates.

A further objective of the invention is to provide control of temperature or temperature distribution across the surfaces of substrates during processing.

According to principles of the present invention, backside gas pressure is varied across the substrate holder to control substrate conditions and condition variation or uniformity across the substrate during processing.

According to other principles of the present invention, one or more process parameters is varied across the substrate to improve process uniformity across the surface of a substrate that is supported on a substrate holder.

In accordance with certain embodiments of the invention, temperature or temperature distribution is controlled across the surface of a substrate being processed by varying the thermal conductivity between the substrate and the substrate holder.

In certain embodiments of the invention, gas pressure can be controlled across the back of a substrate on a substrate holder in response to pressure, temperature, or other parameter measurements across the substrate or substrate support. Such control can be implemented automatically or interactively by a programmed controller of a processing apparatus.

Described embodiments of the present invention are predicated in part upon the concept that the thermal conductivity of the backside gas between the substrate and the substrate holder strongly depends upon the pressure of gas between the substrate and the substrate holder. Accordingly, embodiments of the invention are provided in which backside gas pressure is varied across the back of the substrate to facilitate a change in the thermal conductance between the substrate and substrate holder and, thus, facilitate a change in the substrate temperature.

According to other embodiments of the present invention, a method and an apparatus are provided that can control the radial or non-radial temperature distribution across a substrate during processing. In certain embodiments, substrate temperature is controlled in a way that compensates for or offsets non-uniform effects of process conditions. In particular embodiments, the temperature of the substrate can be controlled in a non-uniform manner to offset the non-uniform effects of operating conditions, for example, of the effects of a non-uniform distribution of plasma density, process chemistry, process pressure, or combination thereof.

In accordance with illustrated embodiments of the invention, heat transfer gas supplied to and removed from the backside of the substrate is dynamically controlled across different zones on a substrate supporting chuck. The dynamic control of the supply of heat transfer gas causes a spatial variation of the heat conduction between the chuck and the substrate across the surface of the substrate. The dynamic control can adjust the effects of the backside gas to offset the effects of non-uniformities caused by other process conditions. The dynamic control is particularly useful in overcoming radial and angular non-uniformity.

In certain embodiments of the invention, the flow of a backside gas, for example, helium, is dynamically varied across the chuck to better control the uniformity of the processing of a substrate. Further, dynamic flow duration can, for example, be choreographed to offset effects of non-uniformity of an incoming substrate or to offset non-uniformity of a static etch process.

According to certain exemplary embodiments of the invention, the substrate holder is divided into zones or areas. These areas may be, for example, about the size of the dies on the substrate. The exact pattern shape of the zones and the number of zones can be separately determined or designed empirically based on simulations and measured uniformity results. Zones can be dynamically adjusted at a pre-selected frequency, and this frequency may vary depending upon the process condition, for example. Multi-zone, dynamically controlled supply and evacuation of heat transfer gas can be provided in order to compensate for non-uniformity of incoming substrates and the non-uniformity of process conditions, in order to obtain a uniform etch result of, for example, critical dimensions, etch profile, etc.

This invention provides an effective way for controlling the spatial distribution of temperature across the surface of a substrate. The method includes the dynamic variation of the supply and evacuation of heat transfer gas to and from the backside of the substrate. The method can be used with multiple-zone, temperature-controlled chucks or with single zone chucks. The method can adjust the spatial distribution of substrate temperature between process steps and during a process step.

In the illustrated apparatus embodiments of the invention, a multi-zone chuck is provided in which each zone has at least one port to supply gas and at least one port to remove gas. A pressure regulator is provided for performing at least one of monitoring, adjusting or controlling the gas pressure within the zones. Control is provided that can vary the gas pressure within each zone dynamically in order to adjust the spatial uniformity of process results on the surface of the substrate.

Gas zones can be activated across the substrate, while previously activated zones can be de-activated in a dynamic, controlled manner. Each zone can be provided with an array of ports, inlet or outlet or both, that can be grouped by gas distribution manifolds or otherwise. The grouping, for example, can define the zones, although surface features, such as ridges, can alternatively or in addition be provided in the chuck can be used to delineate the zones.

The supply and removal of heat transfer gas can be initiated and then disrupted, causing the local temperature at positions with the disrupted backside gas flow to increase while causing the local temperature at positions with the initiated backside gas flow to decrease. The timing or sequencing of these changes in flow by zones can produce a dynamic pressure distribution or pressure wave on the backside of the substrate that, in turn, can affect a dynamic temperature distribution or thermal wave that propagates radially, or circumferentially or otherwise, across the substrate. For example, the timing or sequencing of the supply and removal of heat transfer gas can be performed to create a pressure wave of substantially constant phase speed. Alternatively, the timing or sequencing of the supply and removal of heat transfer gas can be performed to create a pressure wave that is variable, spatially or temporally or both, in phase, speed, amplitude or otherwise. Alternate methods can use combinations of systematic zones or random zones across the substrate. Moreover, multiple zones can be changed at the same time.

These and other objects and advantages of the present invention will be more readily apparent from the following detailed description of illustrated embodiments of the invention.

DETAILED DESCRIPTION

In the following description, for purposes of explanation and not limitation, specific details are set forth, such as a particular geometry of the substrate processing system and descriptions of various processes. However, it should be understood that the invention may be practiced in other embodiments that depart from these specific details.

The substrate processing system can comprise a plasma processing system configured to treat a substrate with plasma. Alternatively, the substrate processing system can comprise a non-plasma processing system configured to treat a substrate. The substrate processing system may comprise an etching system that utilizes plasma to facilitate a dry etching process during semiconductor manufacturing. Examples of an etching system are provided in U.S. Pat. No. 6,492,612 and PCT Publication WO 02/086957; each of which are hereby expressly incorporated herein by reference. Nonetheless, the invention can be used for improving uniformity in deposition systems or in other processing systems.

For example, the substrate processing system may include a thermal treatment module in a photoresist coating system such as a track system; a vapor deposition system such as a chemical vapor deposition (CVD) system, a plasma enhanced CVD (PECVD) system, an atomic layer deposition (ALD) system, a plasma enhanced ALD (PEALD) system, a physical vapor deposition (PVD) system or an ionized PVD (iPVD) system; a dry plasma etching system; a dry non-plasma etching system; a dry cleaning system; an ashing system; a chemical oxide removal (COR) system; or a single substrate thermal processing system configured to thermally treat a substrate.

The substrate processing system may be configured to process a substrate of arbitrary shape. A typical substrate may be a circular wafer of various diameters including, but not limited 200 millimeters (mm), 300 mm, 450 mm, or larger. Additionally, for example, the substrate may be a semiconductor substrate, such as a silicon substrate or SiGe substrate, or a silicon-on-insulator (SOI) substrate. Alternatively, for example, the substrate may have a rectangular shape, such as a flat panel or liquid crystal display (LCD).

Figure 1:
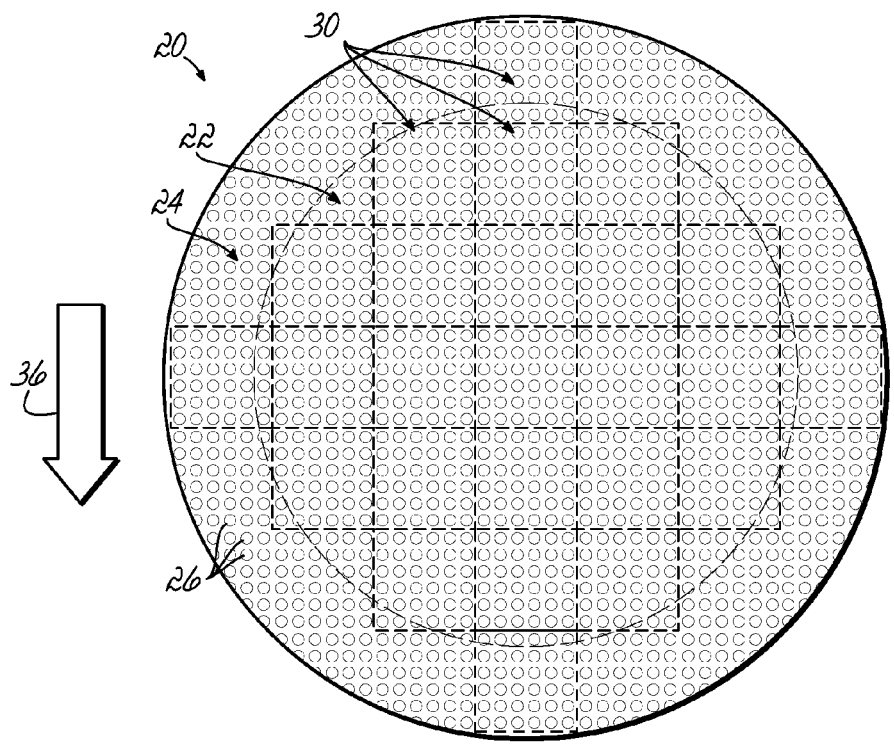
FIG. 1 is a diagram of an upper surface of a substrate supporting chuck sub-divided into multiple controlled backside gas zones according to one embodiment of the invention.

In the drawings, where like reference numerals designate identical or corresponding parts throughout the several views, FIG. 1 is a plan view of the face of a substrate support table 20 for supporting a substrate for processing in the process chamber of a substrate processing module, for example, the etch module referred to above. The table 20 comprises a substrate clamping system (e.g., electrical or mechanical clamping system) to clamp the substrate to the upper surface of table 20. For example, table 20 may include an electrostatic chuck (ESC). The clamping system provides a clamping force that is sufficiently great to overcome the opposing pressure force resulting from the supply of heat transfer gas to the backside of the substrate. Furthermore, the clamping force may be adjustable to affect an increase or decrease in substrate contact with the table 20. The design and implementation of a substrate clamping system is well known to those skilled in the art of semiconductor manufacturing equipment and of mechanical and electrostatic clamping systems.

The table 20 comprises a table temperature control system having one or more temperature control elements. The table temperature control system can include a heating system, or a cooling system, or both. For example, table 20 can include a substrate heating element or substrate cooling element (not shown) beneath the surface of the table 20. For instance, the heating system or cooling system can include a re-circulating fluid flow that receives heat from table 20 and transfers heat to a heat exchanger system (not shown) when cooling, or transfers heat from the heat exchanger system to the table when heating. The cooling system or heating system may include heating/cooling elements, such as resistive heating elements, or thermoelectric heaters/coolers located within table 20. Additionally, the heating elements or cooling elements or both can be arranged in more than one separately controlled temperature zone. As illustrated in FIG. 1, the support table 20 may have two thermal zones, including an inner circular zone 22 and an outer annular zone 24. The temperatures of the zones 22 and 24 may be controlled by heating or cooling the support table thermal zones separately.

The upper surface of the table 20 may be provided with an array of gas ports 26 through which a heat transfer gas, such as helium, can be introduced to, or removed from, the space between the backside of the substrate and the upper surface of the table 20. The introduction of heat transfer gas to the backside of the substrate facilitates an increase in the thermal conduction between the substrate and table 20, while removal of heat transfer gas from the backside of the substrate facilitates a decrease in the thermal conduction between the substrate and table 20. In an etch system, the typical pressure of the heat transfer gas may be approximately 30 Torr, typically exceeding the processing pressure in the vacuum processing chamber and, hence, this difference in pressure results in a net force on the substrate outward from the surface of the support table 20. As described above, this pressure force is overcome by a clamping system, for example, by an electrostatic chuck that provides an electrostatic clamping force to hold the substrate to the table 20. In conventional systems, the introduction of heat transfer gas is typically maintained in a static condition between the substrate and the support surface of the table 20.

According to the embodiment illustrated in FIG. 1, the gas ports 26 are arranged and grouped into zones or areas. For example, the groups of ports 26 may be arranged in a Cartesian, or grid-like, manner. As an example of such a case, a rectangular array of twenty-five square zones 30 is depicted. However, the shape of each zone or number of zones or both can be arbitrary. For instance, each zone can correspond to a substrate die.

Figure 3:
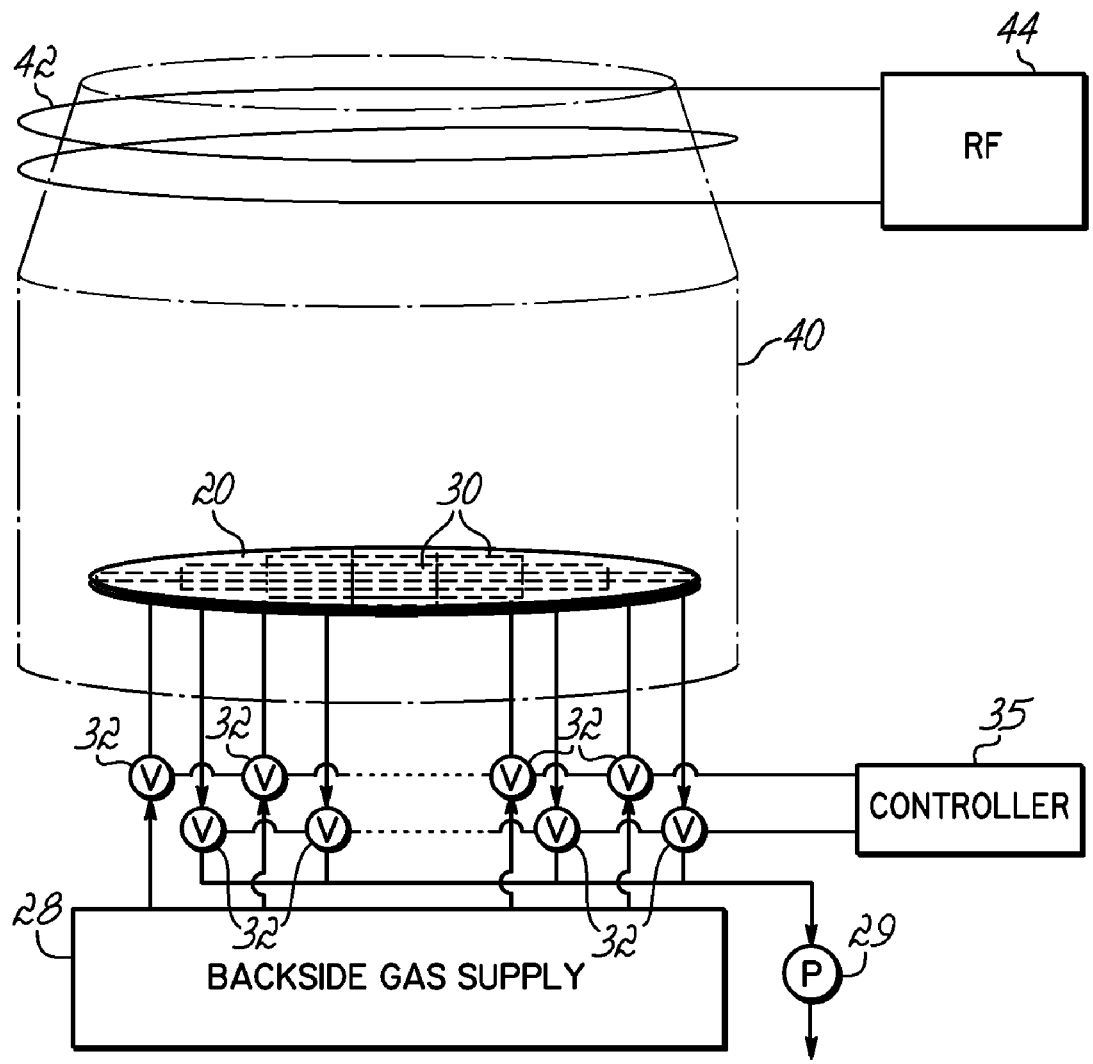
FIG. 3 is a simplified diagram of a plasma processing system having a substrate supporting chuck.

Each of the zones 30 includes at least one gas port through which heat transfer gas can be introduced or through which heat transfer gas can be removed. For instance, as shown in FIG. 1, each zone may have a set of thirty-six gas ports 26. At least some fraction of these gas ports 26 may be coupled to a gas supply source 28 through a zone control valve 32, as illustrated in FIG. 3. At least some fraction of these gas ports 26 within a zone 30 may be coupled to an exhaust or pumping system 29 through another control valve 32. Gas ports for supplying heat transfer gas can be independent from gas ports for removing heat transfer gas, as depicted in FIG. 3. Alternatively, gas ports for supplying heat transfer gas may also be utilized for removing heat transfer gas. In such a case, at least two control valves may be utilized for each zone to alternatively either valve off flow to the exhaust and permit a flow of heat transfer gas to the substrate or valve off the flow from the gas supply source and permit flow from the substrate to the exhaust.

Gas ports 26 corresponding to a specific zone 30 that are configured to supply heat transfer gas to the zone can be coupled to a common gas supply manifold, while gas ports 26 corresponding to a specific zone 30 that are configured to remove heat transfer gas from the zone can be coupled to a common exhaust manifold. Additionally, the grouping of gas ports 26 can be further delineated by surface features (not shown), such as ridges, in the table 20.

A zone can be activated to supply heat transfer gas to the zone while a previously activated zone is de-activated to remove heat transfer gas from the zone. Activation or deactivation of zones can be implemented in a dynamic, controlled manner. Each control valve 32 through which heat transfer gas is supplied to the backside of the substrate includes or is used in conjunction with a pressure regulator to set the gas pressure at the specific zone. For example, the gas pressure delivered to each zone can range from several Torr to approximately 100 Torr. Additionally, for example, the gas pressure delivered to each zone can range from 10 Torr to approximately 50 Torr. For example, during activation of a zone, the gas pressure can be increased to 50 Torr, while during deactivation, the gas pressure can be decreased to approximately 10 to 30 Torr or less.

The supply and removal of heat transfer gas can be initiated and then disrupted, causing the local temperature at positions with the disrupted backside gas flow to increase while causing the local temperature at positions with the initiated backside gas flow to decrease. The timing or sequencing of these changes in flow by zones can produce a dynamic pressure distribution or pressure wave on the backside of the substrate that, in turn, can affect a dynamic temperature distribution or thermal wave that propagates radially, or circumferentially or otherwise, across the substrate. The term "pressure wave" is used herein to refer to a spatially varying pressure imposed on the backside of the substrate, and is not meant to be confused with an acoustic pressure wave in the conventional sense which is a longitudinal wave that depends upon inter-molecular collisions within a continuum gaseous atmosphere. The timing or sequencing of the supply and removal of heat transfer gas can, for example, be performed to create a pressure wave of substantially constant phase speed. Alternatively, the timing or sequencing of the supply and removal of heat transfer gas can be performed to create a pressure wave of spatially and/or temporally variable phase speed. Alternate methods can use combinations of systematic zones or random zones across the substrate. Moreover, multiple zones can be changed at the same time.

The control valves 32 for each zone can be separately controllable by a controller 35. For example, the controller 35 can control the valves 32 in a sequence from one edge of the table 20 to the opposite edge so as to create a thermal wave across the substrate, such as in the direction of the arrow 36 in FIG. 1. Alternatively, the controller 35 can control the valves 32 in sequence in a circumferential direction about the center of the table 20 so as to create a circumferentially propagating thermal wave that propagates about the center of the substrate, such as in the direction of the arrow 38 in FIG. 2. Alternatively yet, the controller 35 can control the valves 32 in sequence in a radial direction towards or away from the center of the table 20 so as to create a radially propagating thermal wave that propagates radially inward towards the center or radially outward from the center of the substrate, such as in the direction of the arrows 39 in FIG. 2. Other patterns can alternatively be employed.

Figure 4A:
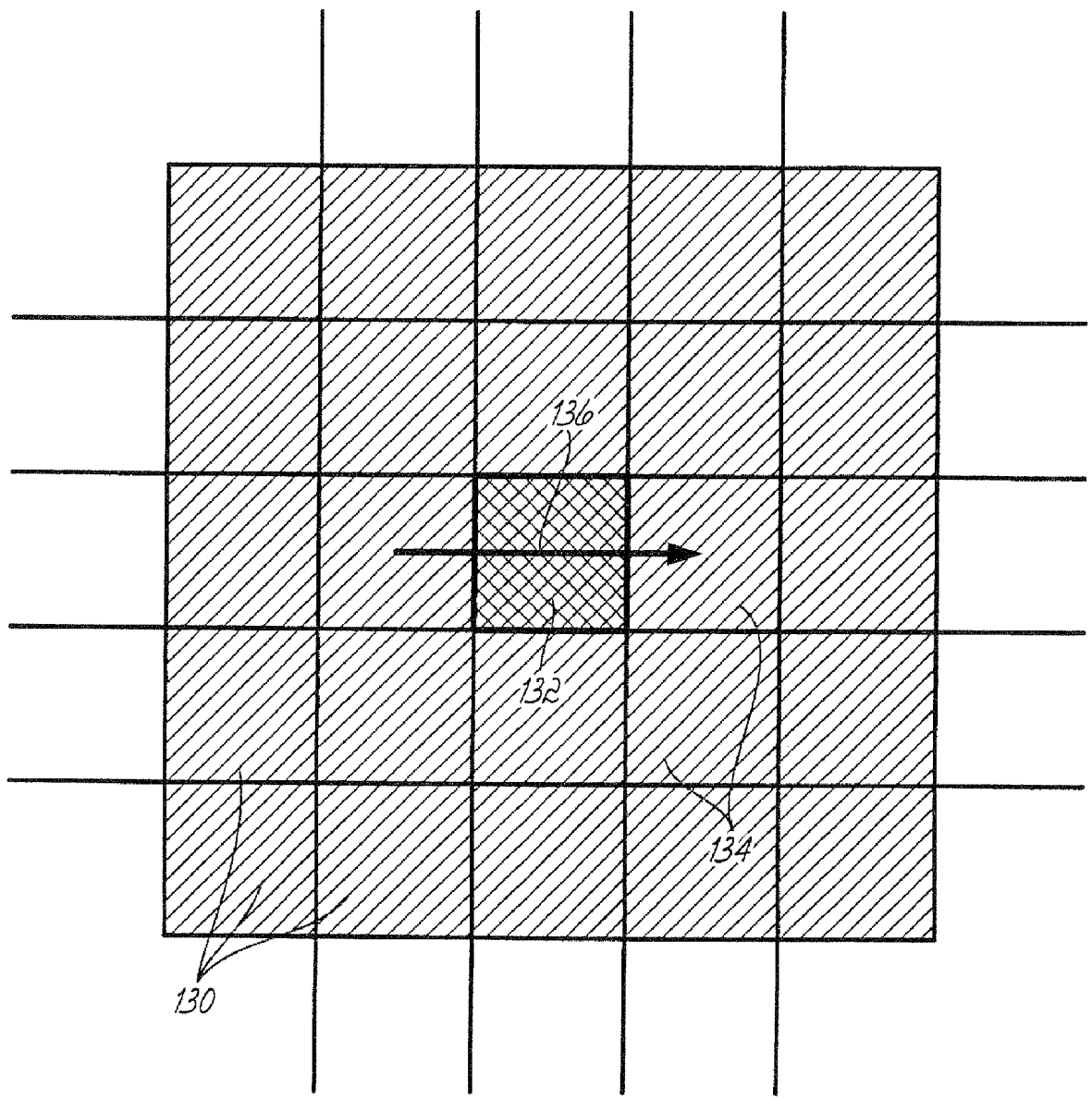
FIGS. 4A through 4C illustrate a method of dynamically altering the pressure on the backside of the substrate at one or more zones.
Figure 4B:
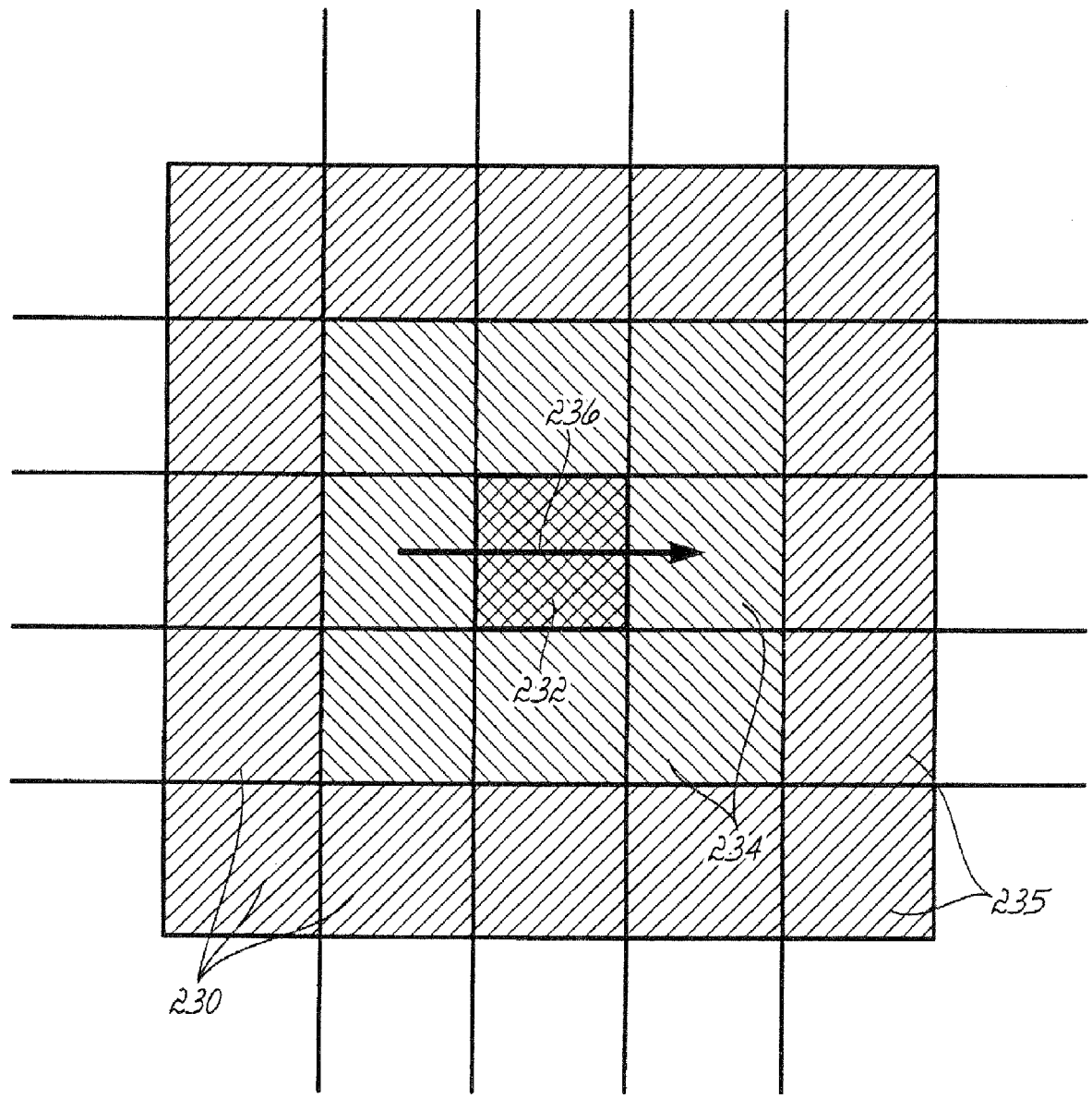
Figure 4C:
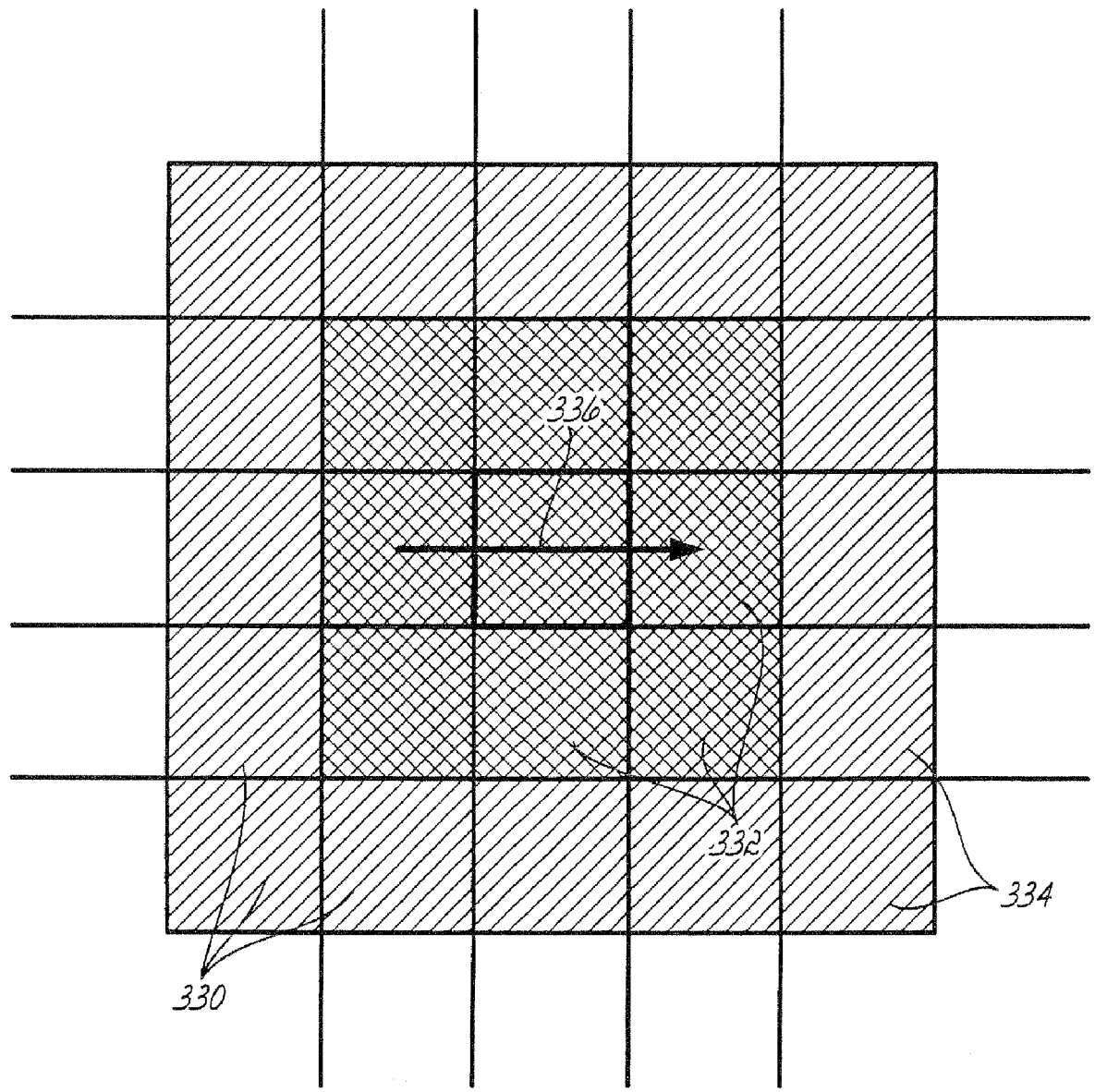

Referring now to FIGS. 4A through 4C, several examples are further provided to illustrate dynamic adjustment of the backside pressure. As shown in FIG. 4A, a plurality of zones 130 are provided in a grid-like arrangement. One zone 132 is activated for a first duration of time, while surrounding zones 134 are de-activated. The de-activation of surrounding zones 134 may include operating these zones at a reduced pressure (relative to zone 132), or it may include evacuating these zones. Following the first duration of time, the activated zone 132 may be de-activated, and the adjacent zone may then be activated as illustrated in the direction of operation 136 in FIG. 4A.

As shown in FIG. 4B, a plurality of zones 230 are provided in a grid-like arrangement. One zone 232 is activated for a first duration of time, while surrounding zones 235 are de-activated. The de-activation of surrounding zones 235 may include operating these zones at a reduced pressure (relative to zone 232), or it may include evacuating these zones. Moreover, intermediate zones 234 may be activated at an intermediate pressure, e.g., a value between the activated zone 232 and the surrounding zones 235. Following the first duration of time, the activated zone 232 may be de-activated, and the adjacent zone may then be activated as illustrated in the direction of operation 236 in FIG. 4B.

As shown in FIG. 4C, a plurality of zones 330 are provided in a grid-like arrangement. Several zones 332 are activated for a first duration of time, while surrounding zones 334 are de-activated. The de-activation of surrounding zones 334 may include operating these zones at a reduced pressure (relative to the activated zones 332), or it may include evacuating these zones. Following the first duration of time, the activated zones 332 may be de-activated, and the adjacent zones may then be activated as illustrated in the direction of operation 336 in FIG. 4C.

Table 20 can further comprise a temperature monitoring system (not shown) and one or more temperature measuring devices. Controller 35 can be coupled to the temperature monitoring system and can be configured to perform at least one of adjusting, controlling, or monitoring the temperature of the substrate, or the table 20, or both, at one or more locations.

The temperature measuring device can include an optical fiber thermometer, an optical pyrometer, a band-edge temperature measurement system as described in pending U.S. patent application Ser. No. 10/168,544, filed on Jul. 2, 2002, the contents of which are incorporated herein by reference in their entirety, or a thermocouple such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg Model No. FT-1420.

A spatial map of temperature, for example, or a spatial map of a process result, including for example a critical dimension, profile, side-wall angle (SWA), etch rate, deposition rate, film thickness, etc., may be utilized to dictate the control scheme for adjusting the supply of heat transfer gas to different thermal zones on the backside of the substrate. For example, if a spatial map of the etch rate of a substrate, or a spatial map of the pattern CD of a substrate following lithography, is acquired and a relationship between the etch rate or CD and substrate temperature is understood (e.g., etch rate increases with higher temperature), then at least one of the gas pressure for a particular thermal zone or the time that a specific thermal zone is activated (supplied with heat transfer gas at a specific pressure) or de-activated (supplied with heat transfer gas at a reduced pressure and/or evacuated) can be adjusted accordingly. For instance, thermal zones requiring a lower etch rate (to correct for the acquired non-uniform spatial map of the etch rate) may be operated at higher backside pressure and/or longer time durations, whereas thermal zones requiring a greater etch rate may be operated at lower backside pressure and/or shorter time durations.

Controller 35 may typically include a microprocessor, a memory, and a digital input/output (I/O) port, potentially including digital/analog (D/A) and/or A/D converters, capable of generating control voltages sufficient to communicate and activate inputs to table 20 as well as monitor outputs from table 20. As shown in FIG. 3, controller 35 can be coupled to and exchange information with control valves 32, the gas supply system 28, the pumping system 29, the clamping system (not shown), the table temperature control system (not shown), and the temperature monitoring system (not shown). A program stored in the memory interacts with the components of the thermal treatment assembly according to a stored process recipe.

The controller 35 may also be implemented as a general purpose computer, processor, digital signal processor, etc., which causes a thermal treatment assembly to perform a portion or all of the processing steps of the invention in response to the controller 35 executing one or more sequences of one or more instructions contained in a computer readable medium. The computer readable medium or memory is configured to hold instructions programmed according to the teachings of the invention and can contain data structures, tables, records, or other data described herein. One example of controller 35 may be a general purpose computer such as a DELL PRECISION WORKSTATION 640™, available from Dell Corporation, Austin, Tex. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 35 may be locally located relative to the table 20, or it may be remotely located relative to the table 20, connected thereto via an internet or intranet. Thus, controller 35 can exchange data with the table 20 using at least one of a direct connection, an intranet, or the internet. Controller 35 may be coupled to an intranet at a customer site (i.e., a device maker, etc.), or coupled to an intranet at a vendor site (i.e., an equipment manufacturer). Furthermore, another computer (i.e., controller, server, etc.) can access controller 35 to exchange data via at least one of a direct connection, an intranet, or the internet.

Figure 2:
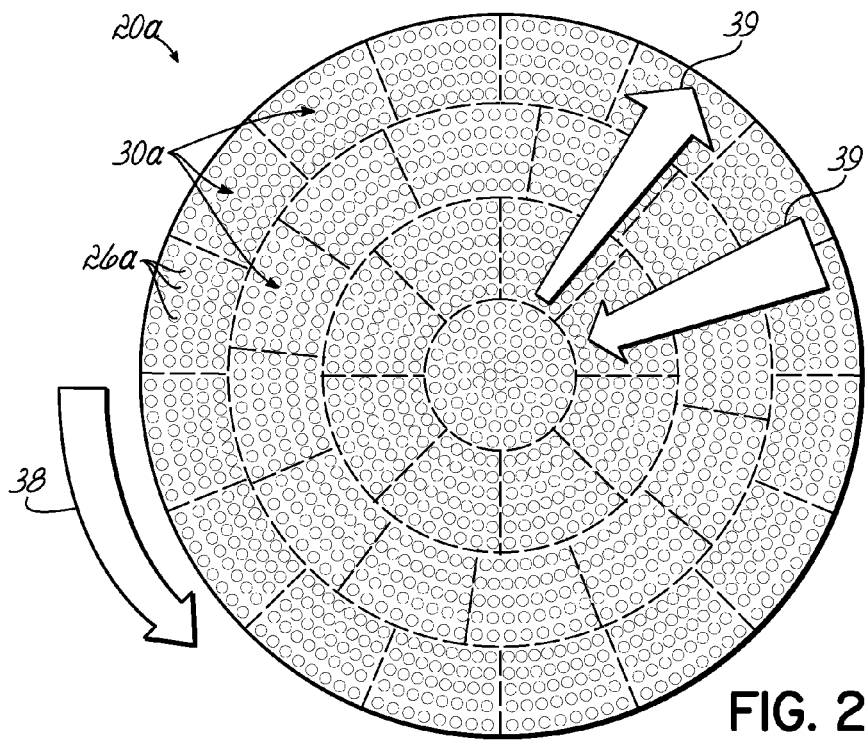
FIG. 2 is a diagram similar of an upper surface of a substrate supporting chuck sub-divided into an alternative pattern according to another embodiment of the invention.

FIG. 2 illustrates an alternative support table 20a having a concentric annular array of zones 30a, and concentric rings of gas ports 26a, grouped to a valve that controls flow to or from the ports 26a within each zone 30a, which can be operated in a manner similar to the zones 30 in FIG. 1. Various zone patterns can be used. The embodiment of FIG. 1 can more easily produce the pattern represented by the arrow 36, while that of FIG. 2 can more easily produce the patterns represented by the arrow 38 and arrows 39, although either can be controlled to approximate each or another pattern.

The support tables 20 or 20a are typically situated in an upwardly facing orientation at the bottom of a vacuum chamber 40, as shown in FIG. 3, to support a substrate facing a plasma source 42 located above the substrate in an upper portion of the chamber 40. In this case, the plasma source 42 is a coil or antenna coupled to an RF generator 44 that produces an inductively coupled plasma in the chamber 40. Alternatively, the plasma source 42 comprises an electrode that produces a capacitively coupled plasma.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of controlling process uniformity across the surface of a substrate comprising:
    supporting a substrate on a substrate support in a vacuum chamber for processing;
    providing backside gas via a plurality of ports in the substrate support to a respective plurality of different areas across the substrate support into a space between the substrate support and the substrate;
    monitoring a temperature or pressure parameter at each of a plurality of the different areas across the substrate supporting surface; and
    in the response to the monitoring of the parameter, separately controlling the pressure of the backside gas at different ones of the ports of the plurality to control separately, in the different areas around the respective ones of said ports, the backside gas pressure across the substrate during processing.

2. The method of claim 1 wherein:
    the monitoring of the parameter includes monitoring temperature at a plurality of the different areas; and
    the controlling of the backside gas pressure includes controlling the pressure to control thermal conductivity between the substrate and the substrate support to thereby affect temperature distribution across the substrate during processing.

3. The method of claim 1 wherein:
    the supporting of the substrate on the substrate support includes holding the substrate to the support with electrostatic force.

4. The method of claim 1 wherein:
    the providing of the backside gas includes injecting the gas through a plurality of ports of each of a plurality of groups of ports lying in a respective plurality of areas across the substrate support.

5. The method of claim 1 further comprising:
separately controlling backside gas flow through the ports in the respective areas according to a sequence that dynamically affects a temperature difference across the surface of the substrate.

6. The method of claim 1 further comprising:
separately controlling backside gas flow through groups of the ports in respective areas across the substrate support to affect the temperature distribution across the substrate in a way that offsets non-uniform effects on process uniformity caused by other process conditions within a processing chamber.

7. The method of claim 1 further comprising:
separately dynamically varying backside gas flow through groups of the ports in respective areas across the substrate support so as to affect the temperature distribution across the substrate in a way that offsets effects of non-uniformity of an incoming wafer or non-uniformity of a static etch process.

8. The method of claim 1 wherein each of said areas of the substrate support has at least two of said ports, including at least backside gas inlet port connected to a supply of backside gas and at least one outlet port connected to a vacuum exhaust system, and wherein the method further comprises:
separately dynamically controlling at least one valve affecting gas flow to or from a port of each of said areas so as to change the temperature distribution across the substrate during processing.

9. A plasma processing apparatus comprising a vacuum chamber, a substrate support in the vacuum chamber having a substrate supporting surface; a plasma source coupled to the vacuum chamber, a plurality of gas ports in the substrate support surface positioned to communicate backside gas between the substrate support surface and a substrate supported thereon for processing, a temperature controlled element in the substrate support for affecting the temperature of a substrate support; a plurality of valves each coupled to at least one of the gas ports of at least a respective one of a plurality of the different areas; and a controller operable to separately control the valves so as to control the backside gas distribution across the substrate support surface to differently affect the thermal conductivity between the support surface and the substrate at the different areas across the substrate according to the method of claim 1.

10. The method of claim 1 further comprising:
controlling backside gas at said ports so as to dynamically vary the temperature of the substrate at least partially along a diameter of the substrate.

11. The method of claim 1 further comprising:
controlling backside gas at said ports so as to dynamically vary the temperature of the substrate at least partially radially from the center of the substrate.

12. The method of claim 1 further comprising:
controlling backside gas at said ports so as to dynamically vary the temperature of the substrate at least partially circumferentially around the center of the substrate.

13. A plasma processing apparatus comprising:
a vacuum chamber;
a substrate support in the vacuum chamber having a substrate supporting surface;
a plasma source coupled to the vacuum chamber;
a plurality of gas ports in the substrate supporting surface positioned to communicate backside gas to or from a space between the substrate supporting surface and a substrate supported thereon for processing at one of a plurality of different areas across the substrate supporting surface;
a temperature controlled element in the substrate support for affecting the temperature of the substrate support;
a plurality of sensors for monitoring a temperature or a pressure at each of a plurality of respectively corresponding ones of the areas across the substrate supporting surface;
a plurality of valves each coupled to different gas ports; and
a controller operable to separately control the valves in response to the monitoring by the plurality of sensors so as to differently control backside gas distribution at different ones of the areas across the substrate supporting surface to affect the substrate temperature distribution across the substrate supporting surface.

14. The apparatus of claim 13 further comprising:
a backside gas supply;
a vacuum exhaust system;
the plurality of valves including at least two valves connected to one or more ports in each of the areas, one connecting the one or more ports to the backside gas supply and one connecting the one or more ports to the vacuum exhaust system; and
the controller being operable to separately control the valves in response to signals from different ones of the sensors to control a flow of backside gas to and from each of the areas to achieve different backside gas pressures in different ones of the areas to control temperature distribution across the substrate supporting surface.

15. The apparatus of claim 13 wherein:
the plurality of sensors is configured to monitor a pressure at each of a plurality of different areas across the substrate supporting surface; and
the controller is operable to separately control the valves in response to signals from different ones of the sensors.

16. The apparatus of claim 13 further comprising:
a plurality of sensors for monitoring temperature across the substrate or the substrate support; and
the controller being operable to separately control the valves in response to signals from different ones of the sensors.

17. The apparatus of claim 13 wherein:
the substrate support is an electrostatic chuck.

18. The apparatus of claim 13 wherein:
the substrate support is an electrostatic chuck having a multi-zone temperature control element therein for separately controlling the temperature of each of a plurality of zones of the support surface.

19. The apparatus of claim 13 wherein:
the ports are arranged in a pattern and divided into a plurality of groups, the ports of each group being disposed over a different respective one of a plurality of areas of the surface of the substrate support, each valve being operable to control the backside gas at a respective one of the groups to affect the thermal conductivity proximate the ports of the respective groups to thereby affect the temperature distribution across a substrate on the support surface.

20. The apparatus of claim 13 further comprising:
a backside gas supply;
a vacuum pumping system;
the substrate support surface including a plurality of areas, each having a plurality of the ports therein including at least one inlet port connected to the backside gas supply and at least one outlet port connected to the vacuum pumping system, at least one of the ports of each area being so connected through a corresponding one of the valves; and the controller being operable to control each valve to control the backside gas so as to affect the local temperature of the substrate proximate the respective area of the support surface to thereby affect the temperature distribution across a substrate on the support surface.

21. The apparatus of claim 13 further comprising:

a backside gas supply;

a vacuum pumping system;

the substrate support surface including a plurality of areas, each having at least one of the ports therein connectable through a corresponding one of the valves to at least one of the backside gas supply and the vacuum pumping system; and the controller being operable to control each valve to control the backside gas to and from different areas so as to affect the local temperature of the substrate proximate the respective area of the support surface to thereby affect the temperature distribution across a substrate on the support surface.

22. The apparatus of claim 21 further comprising:

a plurality of sensors for monitoring temperature across the substrate or the substrate support; and the controller being operable to separately control the valves in response to signals from different ones of the sensors.

23. The method of claim 8 wherein:

the monitoring of the parameter includes monitoring temperature at a plurality of the different areas; and the controlling of the backside gas pressure includes controlling the pressure to control thermal conductivity between the substrate and the substrate support to thereby affect temperature distribution across the substrate during processing.

24. The method of claim 23 further comprising:

separately controlling backside gas flow through the ports in the respective areas according to a sequence that dynamically affects a temperature difference across the surface of the substrate.

\* \* \* \* \*

UNITED STATES PATENT AND TRADEMARK OFFICE
CERTIFICATE OF CORRECTION

| | | |
|---|---|---|
| PATENT NO. | : 7,674,636 B2 | Page 1 of 1 |
| APPLICATION NO. | : 11/684818 | |
| DATED | : March 9, 2010 | |
| INVENTOR(S) | : Radha Sundararajan et al. | |

It is certified that error appears in the above-identified patent and that said Letters Patent is hereby corrected as shown below:

Column 11

Line 22, after "least", insert --one--.

Line 26, after "port of", insert --at least one--.

Line 63, insert --each-- before "positioned".

Signed and Sealed this
Fifth Day of April, 2011

David J. Kappos
*Director of the United States Patent and Trademark Office*